United States Patent [19]

Savignac et al.

[11] Patent Number: 5,546,296
[45] Date of Patent: Aug. 13, 1996

[54] CHARGE PUMP

[75] Inventors: Dominique Savignac, Ismaning; Dieter Gleis, Grosskarolinenfeld; Manfred Menke, Munich, all of Germany

[73] Assignee: Siemens Aktiengesellschaft, Munich, Germany

[21] Appl. No.: 279,919

[22] Filed: Jul. 25, 1994

[30] Foreign Application Priority Data

Jul. 23, 1993 [DE] Germany .......................... 43 24 855.1

[51] Int. Cl.$^6$ .................................................. H03K 19/00
[52] U.S. Cl. .............................. 363/60; 327/536; 307/110
[58] Field of Search ............................... 363/60; 323/351; 327/536; 307/110

[56] References Cited

U.S. PATENT DOCUMENTS

| 4,633,106 | 12/1986 | Backes et al. | 307/578 |
| 5,264,743 | 11/1993 | Nakagome et al. | 307/473 |
| 5,270,588 | 12/1993 | Choi | 307/475 |

OTHER PUBLICATIONS

IEEE Journal of Solid–State Circuits, vol. 26, No. 4 Apr. 1991 (Nakagome et al.) "An Experimental 1.5–V 64–Mb DRAM" pp. 465–472.

*Primary Examiner*—Peter S. Wong
*Assistant Examiner*—Shawn Riley
*Attorney, Agent, or Firm*—Herbert L. Lerner; Laurence A. Greenberg

[57] ABSTRACT

A charge pump assembly includes a storage capacitor having one terminal for a first supply potential and another terminal for pickup of an output potential. The assembly has one charge pump or two charge pumps being controlled by push-pull signals. Each charge pump includes a p-channel MOS transistor having a gate terminal being controlled by a first signal and having a drain-to-source path with one terminal being connected to the other terminal of the storage capacitor. A sliding capacitor has one terminal being connected to the other terminal of the drain-to-source path of the p-channel MOS transistor and another terminal being controlled by a second signal. An n-channel MOS transistor has a gate terminal being controlled by a third signal and a drain-to-source path being connected between a second supply potential and the one terminal of the sliding capacitor. A pulse shaper device is supplied by an oscillator device for generating the signals, in such a way that the p-channel MOS transistor is conducting only whenever the second signal is at a high level, and the n-channel MOS transistor is conducting only whenever the second signal is at a low level.

11 Claims, 6 Drawing Sheets

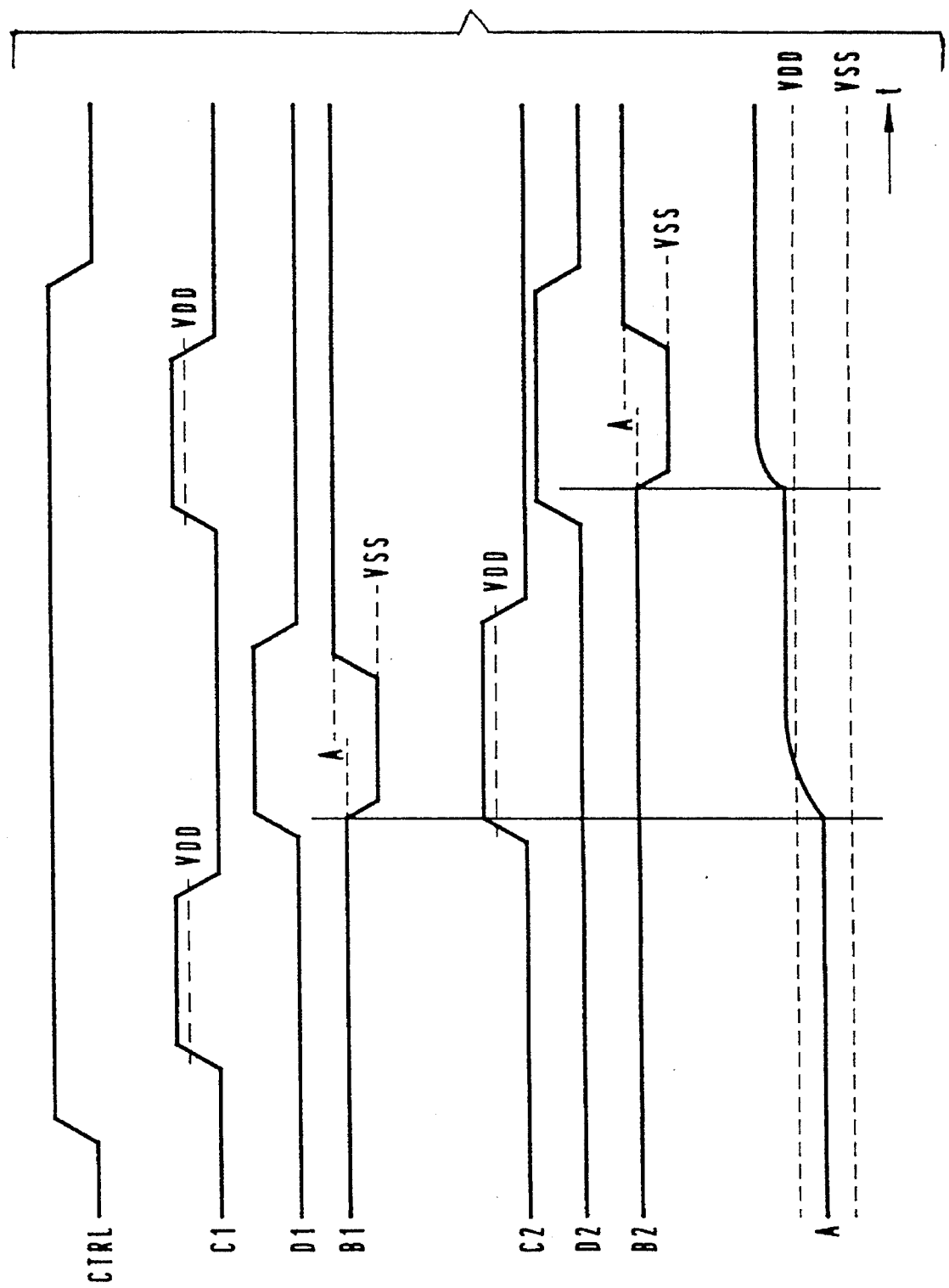

CHARGE PUMP

BACKGROUND OF THE INVENTION

FIELD OF THE INVENTION

The invention relates to a charge pump for generating an increased voltage that is above a supply voltage.

Charge pumps are used in electronic circuits where circuit elements are to be supplied or controlled with a voltage that is higher than the supply voltage of the overall circuit. Such voltages are needed in dynamic memories (DRAMs), for instance. The memory cell of a DRAM typically includes a capacitor that stores the information, to which access is gained through an MOS transistor that is typically of the n-conduction type and is connected as a transfer gate. The voltage of a word line connected to the gate terminal of the selection transistor must be above the supply voltage of the component, in order to enable the reliable writing of information that is to be stored in memory. Moreover, for reasons of reliability, the word line voltage should not exceed a maximum value.

From an article entitled "An Experimental 1.5-V 64-Mb DRAM" by Y. Nakagome et al. in the IEEE Journal of Solid-State circuits, Vol. 26, No. 4, Apr. 1991, it is known to generate the increased voltage by using a charge pump to charge a storage capacitor. The word lines are charged from the storage capacitor by charge transfer in the active phase and are brought to the full increased level with a smaller, two-stage charge slider. An n-channel MOS transistor is used as a switch in the charge pump, between the pump circuit and the storage capacitor. In order to control that transistor, voltages are used that are higher than the increased word line voltage being generated. Under unfavorable operating conditions, that can cause the destruction of the charge pump. Clearly, no precautions are taken to limit the maximum voltage. Moreover, the voltage at the circuit nodes between the n-channel MOS transistor and a sliding capacitor is frozen. If the supply voltage drops, the pump function of the charge pump can become inoperative even within the allowable fluctuation range, because the n-channel MOS transistor is no longer completely blocked.

SUMMARY OF THE INVENTION

It is accordingly an object of the invention to provide a charge pump for generating an increased voltage, which overcomes the hereinafore-mentioned disadvantages of the heretofore-known devices of this general type and which functions reliably in all operating states.

With the foregoing and other objects in view there is provided, in accordance with the invention, a charge pump assembly, comprising a storage capacitor having one terminal for a first supply potential and another terminal for pickup of an output potential, and a charge pump including a p-channel MOS transistor having a gate terminal being controlled by a first signal and having a drain-to-source path with two terminals, one terminal of the drain-to-source path of the p-channel MOS transistor being connected to the other terminal of the storage capacitor; a sliding capacitor having two terminals, one terminal of the sliding capacitor being connected to the other terminal of the drain-to-source path of the p-channel MOS transistor and the other terminal of the sliding capacitor being controlled by a second signal; an n-channel MOS transistor having a gate terminal being controlled by a third signal and having a drain-to-source path being connected between a second supply potential and the one terminal of the sliding capacitor; and an oscillator device and a pulse shaper device being supplied by the oscillator device for generating the first, second and third signals, the p-channel MOS transistor being conducting only whenever the second signal is at a high level, and the n-channel MOS transistor being conducting only whenever the second signal is at a low level.

In accordance with another feature of the invention, the first signal has a high level being at the output potential and a low level being at the first supply potential.

In accordance with a further feature of the invention, the third signal has a high level being higher than the second supply potential and a low level being between the supply potentials.

In accordance with an added feature of the invention, there is provided another MOS transistor being connected as an MOS diode and being connected between the one terminal of the sliding capacitor and the second supply potential.

In accordance with an additional feature of the invention, there is provided a further MOS transistor being connected as an MOS diode and being connected between the other terminal of the storage capacitor and the second supply potential.

In accordance with yet another feature of the invention, there is provided a cross-coupled level converter for generating the levels of the first signal, the level converter being supplied with voltage by the output potential and the first supply potential, and the level converter having an input side being connected to the pulse shaper device and an output side being connected to the gate terminal of the p-channel MOS transistor.

In accordance with yet a further feature of the invention, there is provided another sliding capacitor being connected between the gate terminal of the n-channel MOS transistor and the pulse shaper device; an inverter having an output and having an input side connected to the pulse shaper device; a transfer gate being connected between the gate terminal of the n-channel MOS transistor and the output of the inverter; the inverter having a switching transistor being connected to the first supply potential and having a drain terminal; and a p-channel MOS transistor being connected as an MOS transistor and being connected between the output of the inverter and the drain terminal of the switching transistor.

In accordance with yet an added feature of the invention, there is provided a p-doped semiconductor substrate; and an n-doped well being disposed in the p-doped semiconductor substrate, being at fluctuating potential and having a guard ring; the p-channel MOS transistor being disposed in the n-doped well.

In accordance with yet an additional feature of the invention, there is provided a further p-channel MOS transistor being connected as an MOS diode, being disposed in the well and connecting the well to the output potential.

In accordance with again another feature of the invention, the oscillator is a ring oscillator being turned off by a control signal and beginning to oscillate upon being turned on at a predetermined phase position.

In accordance with a concomitant feature of the invention, there are provided two charge pumps being connected to the other terminal of the storage capacitor and being controlled by push-pull signals.

The transfer transistors between the sliding capacitor and the storage capacitor of the charge pump are constructed as p-channel transistors. This has the advantage of not requiring control voltages that are above the output voltage. In contrast to previous versions, the well of a p-channel MOS transistor is not connected. If the well is small in size and the well capacitance is correspondingly low, the well potential can follow the transistor terminal connected to the sliding capacitor, with only a slight delay. As a result, the injection of current into the substrate is advantageously minimized. In DRAM components, this could otherwise cause destruction of the data stored in memory in the storage capacitor. Through the use of a transistor connected as an MOS diode, the potential of the well is limited at the top inside the well. This embodiment is space-saving.

Other features which are considered as characteristic for the invention are set forth in the appended claims.

Although the invention is illustrated and described herein as embodied in a charge pump, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1b is a signal diagram for the circuit of FIG. 1a;

FIG. 2b is a signal diagram for the circuit of FIG. 2a;

DESCRIPTION OF THE PREFERRED EMBODIMENTS

Figure 1A:
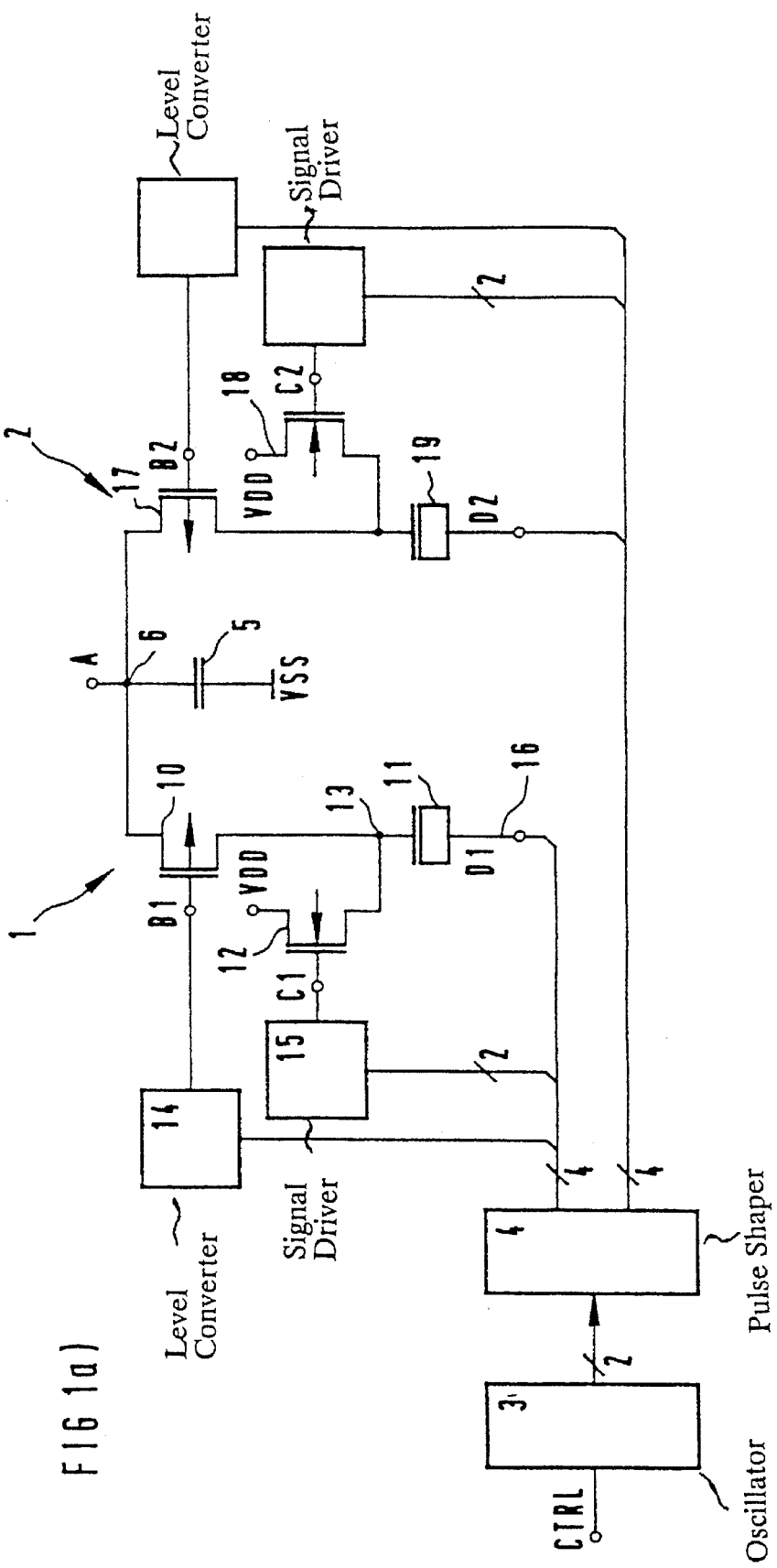
FIG. 1a is a basic schematic and block circuit diagram of a push-pull charge pump.

Referring now to the figures of the drawing in detail and first, particularly, to FIG. 1 thereof, there is seen a charge pump which includes two identical halves 1, 2, operated in the push-pull mode. One terminal of a storage capacitor 5 is at reference potential VSS (ground), which may also be referred to as a first supply potential. The charge pump halves 1, 2 are connected to another terminal 6 of the storage capacitor 5. An output voltage A, which is above a second supply potential VDD after pumping, can be picked up at the terminal 6. By way of example, the terminal 6 is connected through switch devices to selected word line paths of a DRAM in a reading or writing cycle. In order to provide push-pull control of the circuit halves 1, 2, an oscillator 3 is provided that can be turned on and off through a control signal CTRL and has output signals which are generated at the proper time in a pulse shaper device 4 for controlling the charge pump halves. In more detail, the charge pump half 1 includes the following elements: A p-channel MOS transistor 10 is connected as a transfer transistor with one terminal connected to the terminal 6 and another terminal connected to a sliding capacitor 11. The sliding capacitor 11 is preferably constructed as an n-channel MOS transistor. A drain-to-source path of a precharging transistor 12 of the n-conduction type is connected between the supply potential VDD and one terminal 13 of the capacitor 11, which terminal is connected to the transistor 10. A gate terminal of the transistor 10 is controlled by a signal B1 having an L level which is at the potential VSS and an H level which is at the potential of the output signal A. The increased H level of the signal B1 is generated in a level converter 14. A gate terminal of the transistor 12 is controlled by a signal C1 having an H level which is above the supply potential VDD and an L level which is preferably somewhat above the supply potential VSS. The signal levels of the signal C1 are generated in a device 15 from control signals furnished by the pulse shaper device 4. The sliding capacitor 11 has another terminal 16 remote from the storage capacitor 5 that is controlled by a signal D1 which is furnished by the pulse shaper device 4. The other charge pump half 2 is constructed identically, but has a transfer transistor 17, a transistor 18 and a sliding capacitor 19 and is controlled by corresponding staggered control signals B2, C2, D2, so that a push-pull operating mode is attained. The signals B1, D1 and C1 may be described as respective first, second and third signals.

The mode of operation of the charge pump shown in FIG. 1a will be described below in connection with the timing diagram of the control signals shown in FIG. 1b: The oscillator 3 is turned on at a leading edge of the signal CTRL. The corresponding control signals B1, C1, D1 and B2, C2, D2 are derived by the pulse shaper device 4 and the devices 14, 15. In a first step, the transistor 12 is turned on by an H level of the signal C1, which is above the supply potential VDD, so that the sliding capacitor 11 is precharged to the potential VDD. The threshold voltage of the transistor 12 is compensated for by increasing the H level of the signal C1 above the supply potential VDD. The transistor 10 is then blocked. In a second step, the potential of the terminal 16 of the storage capacitor 11 is increased by an H level of the signal D1. At approximately the same time, the transistor 10 is controlled to be conducting, by setting the signal B1 to an L level. As a result, the potential at the terminal or node 13 rises above the potential A at the terminal or node 6, so that the storage capacitor 5 is charged by charge transfer from the sliding capacitor 11. The transistor 12 is then blocked. During this phase, the transistor 18 is controlled to be conducting in the circuit half 2, in order to charge the sliding capacitor 19. Next, through a further H level phase of the signal C1, the sliding capacitor 11 is charged, while in the circuit half 2 the sliding process is carried out. The pumping is continued until such time as the signal CTRL returns to L. This can be attained, for instance, by monitoring the potential A at the output terminal 6 by means of a control device, and resetting the signal CTRL if a level threshold is exceeded.

Since the H levels of the signals B1, B2, which control the transfer transistors 10, 17, are equal to the output signal A, the transistors 10, 17 are reliably blocked during he precharging phase of the respective sliding capacitors 11 and 19. By precharging of the sliding capacitors 11, 19 with the instantaneous supply potential VDD, satisfactory function is assured even if there is a fluctuation in supply potential, for instance if the supply potential VDD is at the lower limit of fluctuation. Through the use of two pumps that operate in chronologically staggered fashion, the current consumption is distributed over a longer period of time, so that disruptive current peaks are avoided for the circuits of the charge pump and of other circuit units in the integrated circuit.

Figure 2A:
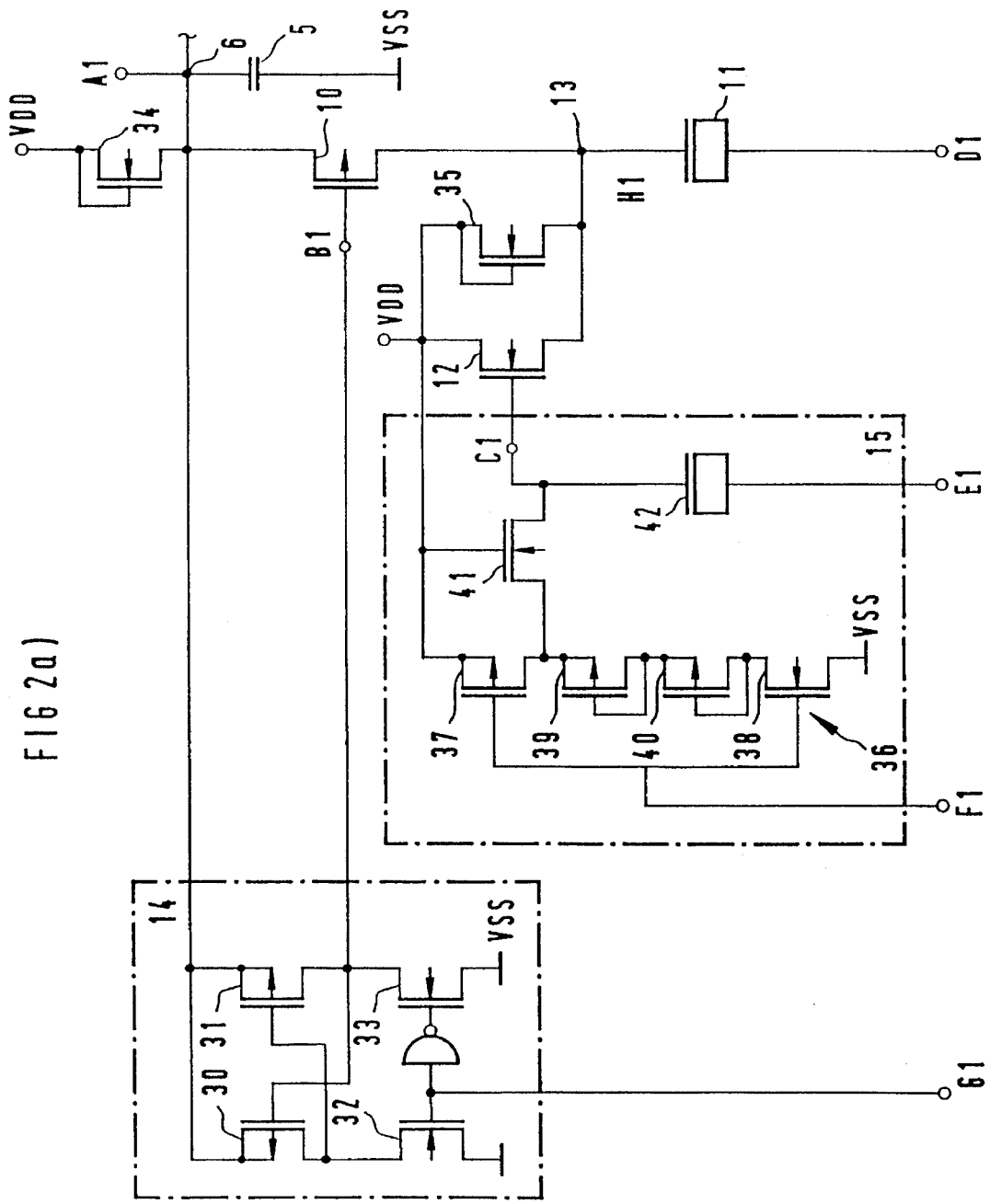
FIG. 2a is a more detailed circuit diagram of one pump half.
Figure 2B:
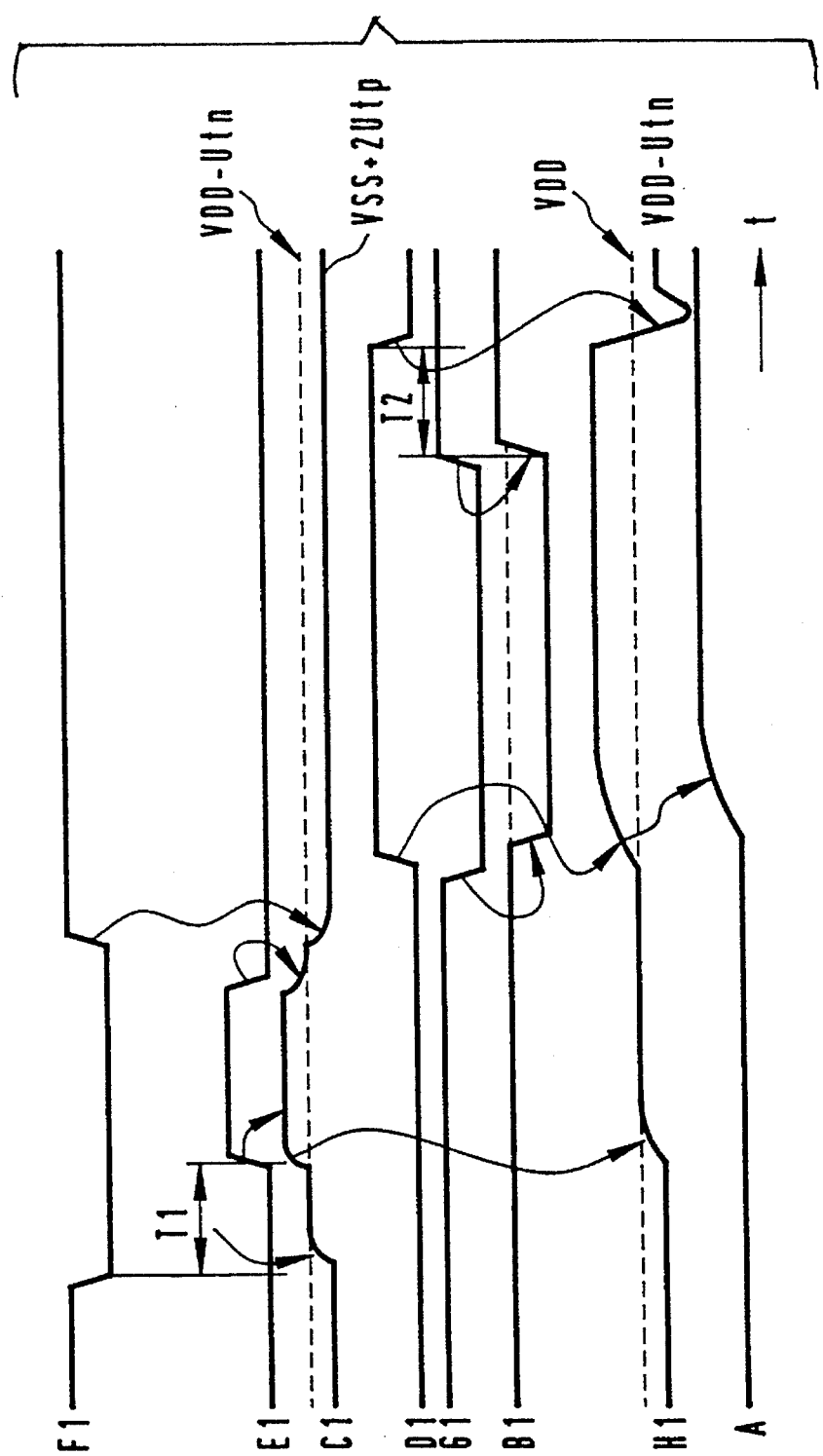

FIG. 2a shows the circuit blocks 14, 15 in a more-detailed embodiment, while the course of the essential signals in a pumping process in the circuit half 1 is plotted over time in FIG. 2b. The same embodiment results with chronologically staggered signals, in the case of the circuit half 2. A cross-coupled level converter is used as the level converter 14 for generating the signal B1 with an H level for the output level A and with an L level for the supply potential VSS. This level converter includes two current paths, which are connected between the output terminal 6 and the supply potential VSS. Each of the current paths contains one of two p-channel MOS transistors 30, 31, having gate terminals which are connected in crossed fashion. One respective n-channel MOS transistor 32, 33 is connected in series with each of the transistors 30, 31. One of the n-channel MOS transistors 32, 33 is controlled by a control signal G1 which is generated in the pulse shaper device 4, and the other is controlled by a signal being complementary thereto. An output of the level converter 14 carries the signal B1, with which the transistor 10 is controlled.

In order to precharge the storage capacitor 5, a further n-channel MOS transistor 34, which is connected as an MOS diode, is connected between the supply potential VDD and the output terminal 6. In order to precharge the sliding capacitor 11, another n-channel MOS transistor 35 is correspondingly provided. The device 15 includes an inverter 36 having two complementary switching transistors 37, 38. Two p-channel MOS transistors 39, 40, which are connected as MOS diodes, are connected between an output of the inverter and a drain terminal of the transistor 38. An input of the inverter 36 is controlled by a control signal F1 generated by the pulse shaper device 4. The output of the inverter 36 is connected through a transfer transistor or gate 41 to the gate terminal of the precharging transistor 12. The gate terminal of the transistor 12 is connected through another sliding capacitor 42 to a further control signal E1 generated by the pulse shaper device 4.

At the beginning of a pumping cycle, the storage capacitor 5 and the sliding capacitor 11 are first charged to a potential VDD-Utn, through the MOS diodes 34 and 35, wherein Utn is the threshold voltage of the transistors 34, 35.

As is shown in the signal diagram of FIG. 2b, the sliding capacitor 11 is then charged further, up to the supply potential VDD, since the precharging transistor 12 is made conducting by an H level of the signal F1 that is higher than the supply potential VDD. To that end, at a trailing edge of the signal F1, the output of the inverter 36 is connected to the potential VDD. The sliding capacitor 42 is precharged through the transfer transistor 41 to the potential VDD-Utn, wherein Utn is the threshold voltage of the n-channel MOS transistor 41. After a delay T1, the signal E1 is switched over to an H level, and the potential at the gate terminal of the transistor 12 rises above the supply potential VDD. The transfer transistor 41 is then blocked. The sliding capacitor 11 is thus fully charged to the potential VDD. After that, the signal E1 drops again to an L level, whereupon the signal C1 drops to the potential VDD-Vtn. The transistor 12 blocks. The signal F1 then switches to H, so that the inverter 36 switches over. Its output is then connected to the potential VSS through the two MOS diodes 39, 40. The potential of the inverter output is thus VSS+2·Utp, wherein Utp is the cutoff voltage of the p-channel MOS transistors 39, 40. It is thus attained that in the ensuing sliding process at the sliding capacitor 11, the transistor 12 will reliably block, and at the same time, the maximum gate-to-source or gate-to-drain voltage at the transistor 12 will be reduced. The sliding process with the sliding capacitor 11 is initiated by the control signals D1, G1. The low point of the capacitor 11 is raised to the potential VDD by the signal D1. The transistor 10 is made conducting by the signal G1 after conversion by the level converter 11. The trailing edge of the signal G1 suitably occurs before the leading edge of the signal D1, so that the transistor 10 is conducting simultaneously with the rise in potential of the capacitor 11, thereby averting voltage peaks at the node 13. The sliding capacitor 11 is thus connected to the storage capacitor 5, so that a charge compensation takes place. With the leading edge of the signal G1, the gate terminal of the transistor 10 is re-applied to the then-raised output potential A, so that the transistor 10 blocks. After a time delay T2, with the trailing edge of the signal D1, the low point of the storage capacitor 11 is re-applied to the potential VSS. The transistor 35 assures that the node 13 is recharged to the potential VDD-Vtn. A rate of rise in a signal H1 at the node 13 and a rate of rise of the output voltage A at the node 6 are less than a rate of rise of the signal B1. This assures that the transistor 10 can be turned off quickly.

Figure 3A:
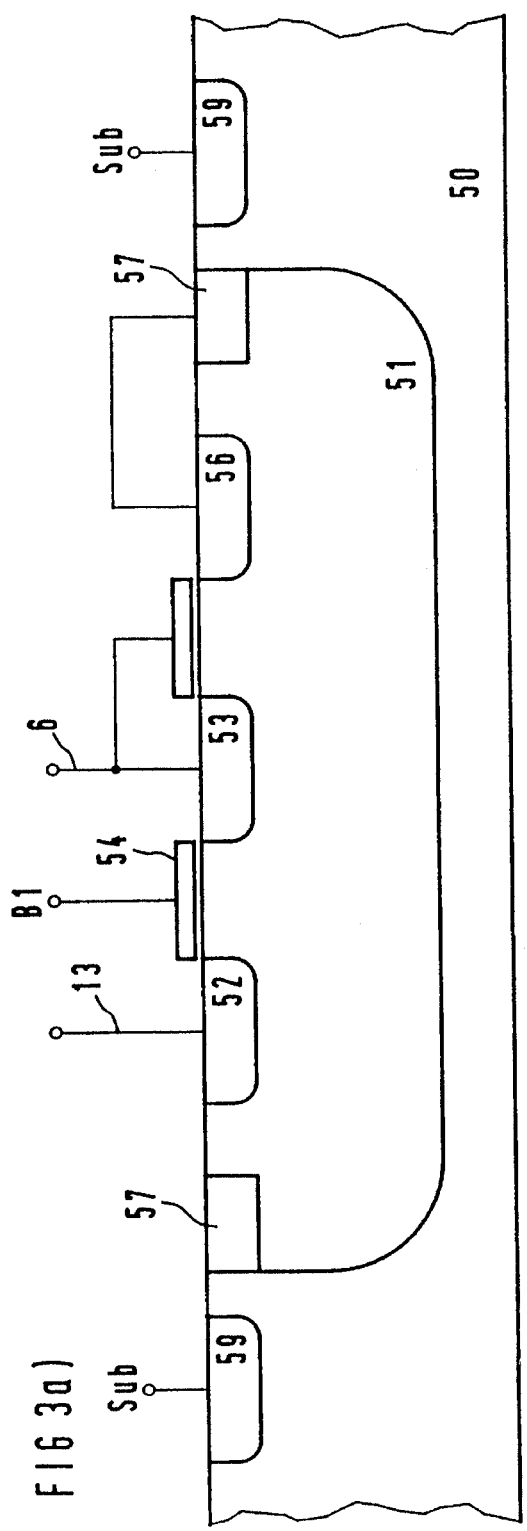
FIG. 3a is a fragmentary, diagrammatic, cross-sectional view of a p-channel MOS transistor between a sliding capacitor and a storage capacitor.
Figure 3B:
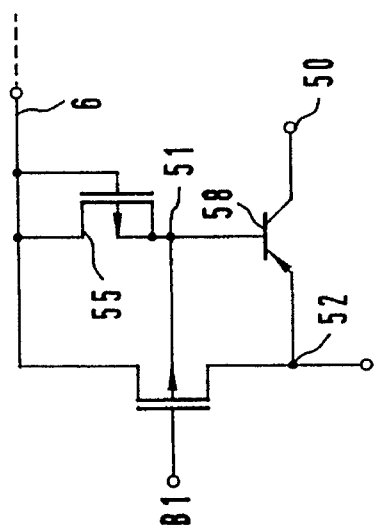
FIG. 3b is an electrical substitute circuit diagram of the p-channel MOS transistor.

A layout of one of the p-channel MOS transistors 10, 17 is shown in FIG. 3a in section and in FIG. 3b as an electrical substitute circuit diagram. As is usual in DRAMs, the assumption is a p-conductive substrate 50, in which an n-conductive well 51 is made in order to achieve a p-channel MOS transistor. The transistors 10, 17 are preferably constructed in separate wells. Each of the transistors includes diffusion zones 52, 53 with a gate 54 located between them. The well is not conducted to potential, or in other words to neither the source nor drain zone nor to a fixed potential. In other words, its potential fluctuates. Suitably, an n-doped guard ring 57 is disposed at the edge of the well 51. A further guard ring 59, which is connected to substrate potential, is also disposed around the well 51 in the semiconductor substrate 50. As a result, any possible charges are dissipated to the side. The well should be dimensioned in such a way that its effective capacitance to the other electrical terminals is low. If the potential of the node 13 rises above the potential of the well 51, a current flows through an emitter-to-base diode of a pnp transistor 58 which is formed by the succession of layers, into the well. The potential of the well thus rises. If there is a low capacitive load, the well can follow rapidly, so that the voltage drop at the emitter-to-base diode is low. The current injection into the semiconductor substrate is minimized, since the bipolar transistor is only slightly level-controlled. The current injection into the substrate should be avoided especially in DRAM components, because current injection can destroy the information stored in the memory cells. The potential of the well is accordingly built up after several pump cycles after the charge pump is turned on. After that, the diode and therefore the pnp transistor remained blocked.

In order to provide an upper limit to the potential of the well and to prevent an uncontrolled rise in the well potential, which would cause a decrease in conductivity of the respective transistor 10 or 17, a further p-channel MOS transistor 55 is provided. The transistor 55 is connected as an MOS diode between the well and the output terminal 6. The well potential is thus limited to a cutoff voltage Utp of the transistor 55 above the output signal A. The transistor 55 can be constructed in a space-saving way by means of an additional doping zone 56 in the well. To that end, a transistor gate that is connected to the output terminal 6 is disposed between the doping zones 53, 56. The doping zone 56 is connected to the guard ring 57 of the well.

Figure 4:
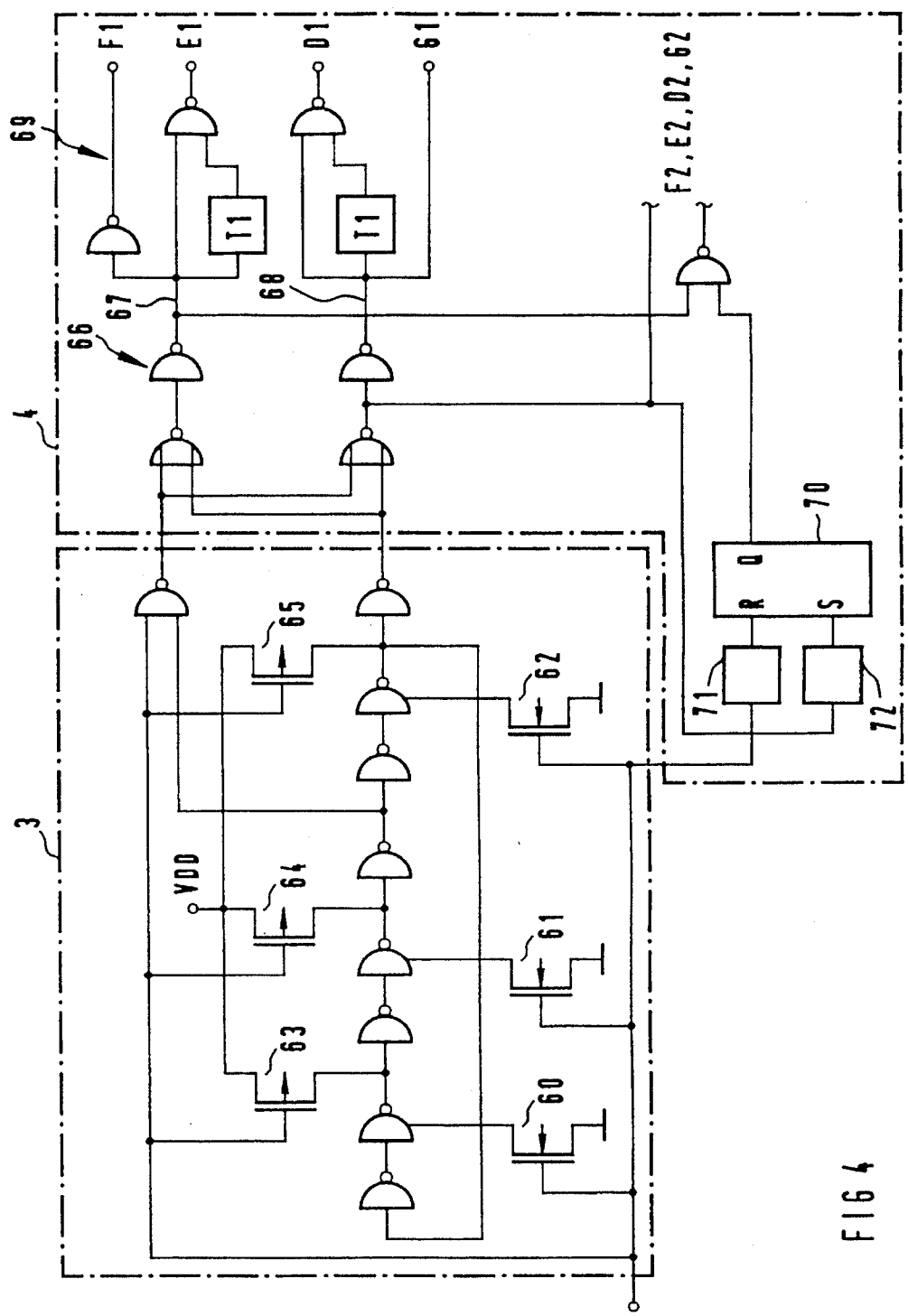
FIG. 4 is a circuit diagram for an oscillator and a pulse shaper device.

In FIG. 4, the structure of the oscillator device 3 and of the pulse shaper device 4 are shown in the form of a logical block diagram. The oscillator 3 is a seven-stage ring oscillator, which is enabled to a predetermined starting state with an H level of the signal CTRL. To that end, n-channel MOS transistors 60, 61, 62 are provided, with which three corresponding inverters of the ring oscillator are connected to reference potential VSS. In order to provide rapid turnoff of the ring oscillator, three p-channel MOS transistors 63, 64, 65 are provided, which connect the outputs of the corresponding inverters with the supply potential VDD, at an L level of the signal CTRL. Circuit means 66 following the outputs of the ring oscillator generate pulse trains with non-overlapping pulses at nodes 67, 68. Through the use of further circuit means 69 that follow the nodes 67, 68, the control signals F1, E1, D1, G1 for controlling the charge pump half 1 are generated, while taking delay lines having the delays T1, T2 into account. The delay T1 is the delay between the trailing or leading edge of the signals F1 and E2, and the delay T2 is the delay between the leading or trailing edge of the signals G1 and D1, as is seen in FIG. 2b. The control signals F2, E2, D1, G1 of the charge pump half 2 are generated with the inverting signals of the nodes 67, 68, by means of further circuit means that are identical to the circuit means 69. In order for the pumping of the charge pump to begin in such a way that first such a pumping operation of the charge pump 1 and then a pumping operation of the charge pump 2 will take place, an RS flip-flop 70 is provided, which is reset at a positive edge of the signal CTRL and is set at a negative edge of the signal present at the terminal 68. To that end, an edge detector 71, 72 is provided at each of the respective reset and set inputs of the flip flop 70. First pulses of the signals D2, G2 are suppressed by the output signal of the flip-flop 70.

We claim:

1. A charge pump assembly, comprising:

a storage capacitor having one terminal for a first supply potential and another terminal for pickup of an output potential, and a charge pump including:

(a) a p-channel MOS transistor having a gate terminal being controlled by a first signal and having a drain-to-source path with two terminals, one terminal of the drain-to-source path of said p-channel MOS transistor being connected to the other terminal of said storage capacitor;

(b) a sliding capacitor having two terminals, one terminal of said sliding capacitor being connected to the other terminal of the drain-to-source path of said p-channel MOS transistor and the other terminal of said sliding capacitor being controlled by a second signal;

(c) an n-channel MOS transistor having a gate terminal being controlled by a third signal and having a drain-to-source path being connected between a second supply potential and the one terminal of said sliding capacitor; and (d) an oscillator device and a pulse shaper device being supplied by said oscillator device for generating the first, second and third signals, said p-channel MOS transistor being conducting only whenever the second signal is at a high level, and said n-channel MOS transistor being conducting only whenever the second signal is at a low level.

2. The charge pump assembly according to claim 1, wherein the first signal has a high level being at the output potential and a low level being at the first supply potential.

3. The charge pump assembly according to claim 1, wherein the third signal has a high level being higher than the second supply potential and a low level being between the supply potentials.

4. The charge pump assembly according to claim 1, including another MOS transistor being connected as an MOS diode and being connected between the one terminal of the sliding capacitor and the second supply potential.

5. The charge pump assembly according to claim 1, including a further MOS transistor being connected as an MOS diode and being connected between the other terminal of said storage capacitor and the second supply potential.

6. The charge pump assembly according to claim 2, including a cross-coupled level converter for generating the levels of the first signal, said level converter being supplied with voltage by the output potential and the first supply potential, and said level converter having an input side being connected to said pulse shaper device and an output side being connected to the gate terminal of said p-channel MOS transistor.

7. The charge pump assembly according to claim 3, including another sliding capacitor being connected between the gate terminal of said n-channel MOS diode and said pulse shaper device; an inverter having an output and having an input side connected to said pulse shaper device; a transfer gate being connected between the gate terminal of said n-channel MOS transistor and the output of said inverter; said inverter having a switching transistor being connected to the first supply potential and having a drain terminal; and a p-channel MOS transistor being connected as an MOS transistor and being connected between the output of said inverter and the drain terminal of said switching transistor.

8. The charge pump assembly according to claim 1, including a p-doped semiconductor substrate; and an n-doped well being disposed in said p-doped semiconductor substrate, being at fluctuating potential and having a guard ring; said p-channel MOS transistor being disposed in said n-doped well.

9. The charge pump assembly according to claim 8, including a further p-channel MOS transistor being connected as an MOS diode, being disposed in said well and connecting said well to the output potential.

10. The charge pump assembly according to claim 1, wherein said oscillator is a ring oscillator being turned off by a control signal and beginning to oscillate upon being turned on at a predetermined phase position.

11. A push-pull charge pump assembly, comprising:

a storage capacitor having one terminal for a first supply potential and another terminal for pickup of an output potential, and two charge pumps being connected to the other terminal of said storage capacitor and being controlled by push-pull signals, each of said charge pumps including:

(a) a p-channel MOS transistor having a gate terminal being controlled by a first signal and having a drain-to-source path with two terminals, one terminal of the drain-to-source path of said p-channel MOS transistor being connected to the other terminal of said storage capacitor;

(b) a sliding capacitor having two terminals, one terminal of said sliding capacitor being connected to the other terminal of the drain-to-source path of said p-channel MOS transistor and the other terminal of said sliding capacitor being controlled by a second signal;

(c) an n-channel MOS transistor having a gate terminal being controlled by a third signal and having a drain-to-source path being connected between a second supply potential and the one terminal of said sliding capacitor; and (d) an oscillator device and a pulse shaper device being supplied by said oscillator device for generating the first, second and third signals, said p-channel MOS transistor being conducting only whenever the second signal is at a high level, and said n-channel MOS transistor being conducting only whenever the second signal is at a low level.

* * * * *